United States Patent [19]

Whitford et al.

[11] Patent Number: 4,779,074
[45] Date of Patent: Oct. 18, 1988

[54] LOW LEVEL VOLTAGE PULSE-CONVERTER

[75] Inventors: Rowland E. Whitford, Painesville; Edward Bastijanic, Concord, both of Ohio

[73] Assignee: The Babcock & Wilcox Company, New Orleans, La.

[21] Appl. No.: 96,742

[22] Filed: Sep. 14, 1987

Related U.S. Application Data

[63] Continuation of Ser. No. 765,405, Aug. 13, 1985, abandoned.

[51] Int. Cl.$^4$ ............................................. H03M 1/52
[52] U.S. Cl. .................................... 341/166; 341/172
[58] Field of Search ................. 340/347 AD, 347 MT, 340/347 SH

[56] References Cited

U.S. PATENT DOCUMENTS

| | | | |
|---|---|---|---|
| 2,937,369 | 5/1960 | Newbold | 340/347 SH |
| 3,271,651 | 9/1966 | Diederich | 340/347 SH |
| 4,178,585 | 12/1979 | Takagi | 340/347 MT |
| 4,191,942 | 3/1980 | Lone | 340/347 MT |
| 4,368,457 | 1/1983 | Tsukada | 340/347 MT |
| 4,390,864 | 6/1983 | Ormond | 340/347 MT |
| 4,644,323 | 2/1987 | Chamran | 340/347 MT |

OTHER PUBLICATIONS

Duke "IEEE Transactions on Instrumentation & Measurement", Feb. 1971, pp. 74–76.
Shum "Electronics Letters", Dec. 6, 1984, vol. 20, No. 25/26, pp. 1041–1042.

Primary Examiner—Charles D. Miller
Attorney, Agent, or Firm—Vytas R. Matas; Robert J. Edwards

[57] ABSTRACT

A convertor for converting an analog signal to a digital pulse comprises a switching capacitor which is charged by a differential analog signal supplied to the switching capacitor over an input circuit. The capacitor is discharged over an output circuit with the aid of a constant current supply. The charge level of the capacitor is proportional to the analog signal so that the time it takes the capacitor to discharge to a selected low charge level, is proportional to the analog signal. This time period is used by a microprocessor control to generate a digital pulse having a pulse equal to the discharge time for the capacitor. The microprocessor also selectively connects the input and output circuits to the capacitor for respectively charging and discharging the capacitor.

2 Claims, 2 Drawing Sheets

LOW LEVEL VOLTAGE PULSE-CONVERTER

This is a continuation of co-pending application No. 06/765,405 filed on 8/13/85, now abandoned.

FIELD AND BACKGROUND OF THE INVENTION

The present invention relates in general to analog-to-digital convertors and in particular to a new and useful voltage-to-pulse convertor which converts an analog signal into a pulse having a duration which is proportional to the analog signal.

Signal conversion of an analog to digital signal for digital processing in low power applications, such as pressure transducers is normally accomplished by a voltage to frequency convertor (V/F). Commercially available A/D convertors are not utilized due to their excessive power consumption. There are not commerically available integrated circuits for analog to digital conversion that are of sufficient low power, that is less than 12 mW, to run from a 4–20 mA current loop.

While V/F convertors can be utilized, they are relatively slow in response time and low in accuracy. The slow conversion of the V/F convertor results from the need for a counting interval that is at least as long as the period for the lowest frequency signal. The response time is a fixed value regardless of the frequency of the signal. This means that a microprocessor used in conjunction with the V/F converter will be tied up during this conversion time. This limits the overall response of the pressure transducer.

With regard to accuracy, a moderate-precision V/F circuit has an accuracy range of about 0.4% to 0.1%. To obtain a high-precision V/F circuit with an accuracy range of 0.03% to 0.01% requires additional components which result in greater power consumption and higher cost.

A convertor which operates at low power consumption and with high accuracy would be particularly useful for a two-wire 4–20 mA current loop.

Two-wire analog transmission systems are well known. Such systems include a transmitter which is connected to a power supply by two wires which form a current loop. The transmitter includes, as at least one of its features, a transducer which senses a condition such as pressure or temperature. This condition is known as a process variable (PV).

A power supply is connected to the two wires to close the current loop. It is also conventional to provide a resistor in the current loop. The transmitter amplifies the signal from its transducer and this amplified signal is used to draw a certain current from the power supply which is proportional or otherwise related to the process variable. It is conventional to draw from a minimum of 4 (mA) to a maximum of 20 mA. The current between 4 and 20 mA passes through the resistor to produce a voltage drop across the resistor. This voltage drop can be measured to give a value for the process variable.

It is noted that the 4 mA minimum current is required to energize the circuitry of the transmitter. Any excess current above this 4 mA level is taken as a value which can be used to determine the process variable.

It is known that such 4–20 mA two-wire systems have an accuracy which is limited to around 0.1% at best. These systems are also essentially unidirectional with the transmitter being essentially uncontrolled and transmitting continuously.

SUMMARY OF THE INVENTION

The present invention utilizes a voltage to pulse V/P principle which operates with less than 3 mW of power. The pulse duration of an output signal from the inventive convertor is proportional to an analog input signal. The conversion time and accuracy of the V/P convertor, with minimal components for low power dissipation, is an improvement over known V/F convertors. Further improvements in accuracy and conversion time are obtained by using input autoranging.

By utilizing such a V/P technique, a microprocessor used in conjunction with the invention will be tied up only for the pulse duration time period. Low power consumption is a result of the minimal number of components needed to implement the V/P circuit and the utilization of low power integrated circuits. Even with this minimal component count, the average tested accuracy of the inventive V/P circuit is +0.03%.

Accordingly an object of the present invention is to provide a convertor for converting an analog signal into a digital pulse which comprises a switching capacitor, an input circuit connectable to the switching capacitor for applying an analog signal to the switching capacitor to charge the capacitor to a charge level which is proportional to the analog signal, an output circuit which is connectable to the switching capacitor and which includes a constant current source for discharging the switching capacitor from the charge level to a selected low level during a discharge period, and switching logic means connected to the input and output circuits for connecting the input circuit to the capacitor while the output circuit is disconnected from the capacitor during a charging period which is sufficiently long to charge the capacitor to its charge level, and for disconnecting the input circuit while the output circuit is connected to the capacitor for discharging the capacitor from the charged level to the selected level during a time which is at least greater than the discharging period. A pulse generating circuit is connected to the output circuit for generating a pulse which has a duration equal or proportional to the charging period, the pulse being usable as a digital pulse signal which is proportional to the analog signal.

A further object of the invention is to provide a method of analog to digital conversion which comprises charging a switching capacitor during a charging period to a charge level which is proportional to an analog signal, discharging the capacitor during a discharging period over a constant current source down from the charged level to a selected low level, and generating a digital pulse having a width which is equal to the discharging period and which can be utilized as digital pulse corresponding to the analog signal.

A further object of the invention is to provide a voltage-to-pulse convertor which has low power consumption, high accuracy and which is simple in design, rugged in construction and economical to manufacture.

The various features of novelty which characterize the invention are pointed with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
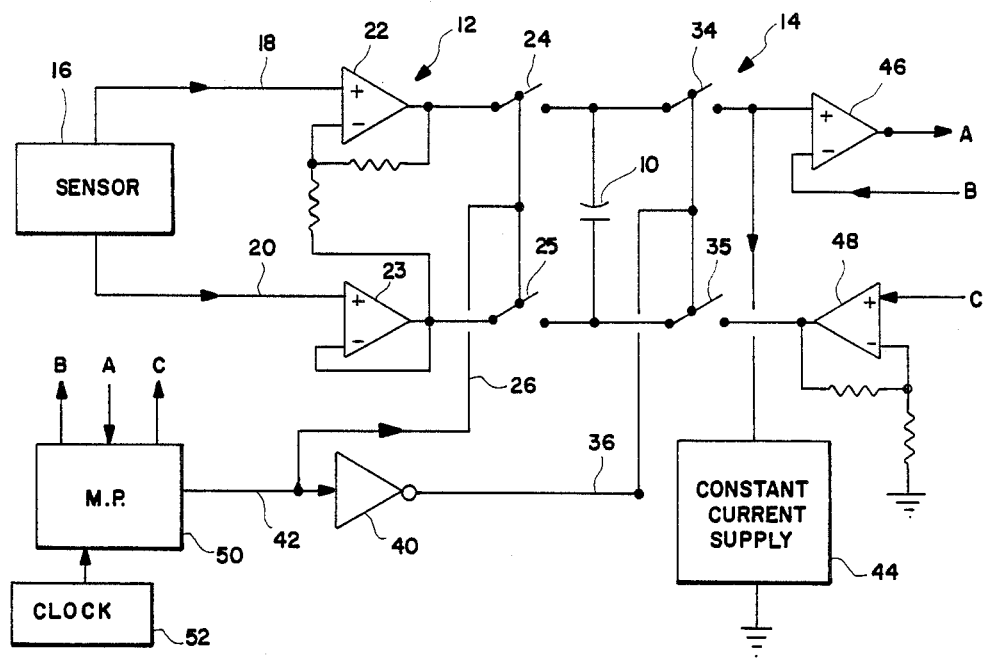
FIG. 1 is a schematic block diagram showing one embodiment of the inventive voltage-to-pulse convertor.

Referring to the drawings in particular, the invention embodied in FIG. 1 comprises a voltage-to-pulse convertor which includes a switching capacitor 10 that is connectable selectively to an input circuit generally designated 12 and an output circuit generally designated 14. A sensor 16 such as a differential strain gage transducer, has a pair of outputs at 18 and 20 which carry different voltages which correspond to a differential in pressure being measured by the sensor 16. Each output is connected to its own operational amplifier 22 and 23 which are connected together to form a high input impedance differential amplifier. In addition to amplifiers 22 and 23, input circuit 12 includes a pair of electronic input switches 24 and 25 which can be closed simultaneously by a signal on a line 26. By applying an appropriate logical signal on line 26, both switches 24 and 25 are closed. The analog signal on lines 18 and 20 is thus applied- over the operational amplifiers, across the switching capacitor 10. As long as switches 24,25 are closed for a long enough charging period, capacitor 10 will be charged up to a level which is proportional to the differential signal on lines 18 and 20.

Output circuit 14 includes a pair of output switches 34 and 35 which can be closed simultaneously by a line 36. Line 36 is connected to the output of an invertor 40. A line 42 is connected to the input of invertor 40 and also directly to the line 26. In this way a high or logical 1 signal applied to line 42 will cause switches 24,25 to close while switches 34,35 are held open. Conversely if a low or logical 0 signal is applied to line 42, switches 24,25 are open and switches 34,35 are closed.

The output circuit 14 includes a constant current source 44 which, with switches 34,35 closed, causes switching capacitor 10 to discharge at a fixed rate. The time it takes capacitor 10 to discharge from its charged level to a selected discharged or low level is utilized to generate a pulse having a width which is equal to that discharge period. The pulse is generated by a comparator 46 which can be in the form of a differential amplifier having a positive input connected to one side of capacitor 10 and a negative input connected to a terminal labeled B. Terminal B receives a trip point voltage which determines the level at which comparator 46 will output a signal on its output line A.

The discharging time for capacitor 10 can also be modified by utilizing a bias input which is applied to terminal C of an amplifier 48. Terminal C can be used for reference and auto-ranging to compensate for factors which might cause the sensor 16 to drift, such as temperature and other pressure conditions.

Terminals A, B and C are connected to a microprocessor 50 which is connected to a clock 52. With the aid of clock 52, microprocessor 50 outputs signals onto line 42. In this way a pulse train can be generated similar to those shown in FIGS. 2 and 3. Both Figures assume a pulse width of 80 ms. It is always assumed that the width of the pulses is at least as great as the maximum time it takes capacitor 10 to be fully charged to its charged level, and fully discharged to the selected low level.

Figure 2:
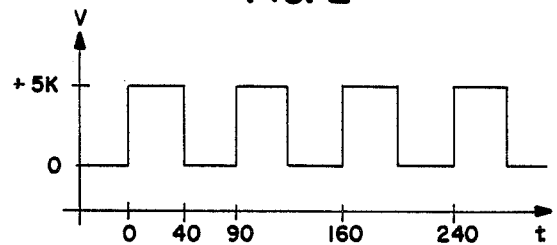
FIG. 2 is a graph showing a pulse train which can be generated utilizing the inventive convertor.

FIG. 2 shows an example where the generated pulse is on for one-half the pulse train period. Capacitor 10 is assumed to have already been charged to its charge level by the differential signal on lines 18 and 20. At time t=0, it is assumed that microprocessor 50 generates a logical 0 signal on line 42. This closes switches 34,35 and opens switches 24,25. Capacitor 10 then immediately begins to discharge over constant current supply 44. As long as this discharge takes place, comparator 46 outputs a high voltage signal, shown as 5 volts in FIG. 2. This continues until 40 ms into the first pulse whereupon the level at the positive input of comparator 46 is equal to the trip point voltage applied to terminal B by microprocessor 50. At this point the output of comparator 46 drops to 0 as shown in FIG. 2. As soon as microprocessor 50 senses that the pulse has dropped to 0 over its input terminal A, it may immediately generate a logical 1 signal on line 42 to close switches 24,25 and open switches 34,35. Alternately an arbitrary time period can be taken which assumes sufficient time has been provided for the discharge of capacitor 10. Enough time must be provided for capacitor 10 to again be charged to its charge level by the differential signal on lines 18 and 20 so that at t=80 ms a new pulse can be generated.

Figure 3:
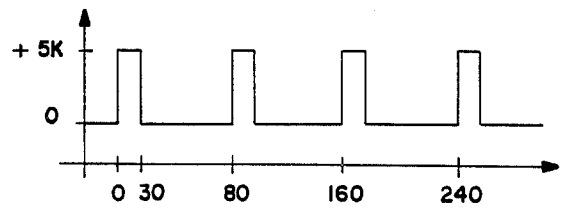
FIG. 3 is a graph similar to FIG. 2 showing a pulse having a different duty cycle which can be generate by the inventive convertor when it receives a different lower analog signal.

FIG. 3 shows the case where there is a lower differential signal on lines 18 and 20 and thereby a correspondingly shorter pulse width.

According to the invention pulses having a variable duty cycle can be generated, the duty cycle being a digital representation of the analog signal.

Figure 4:
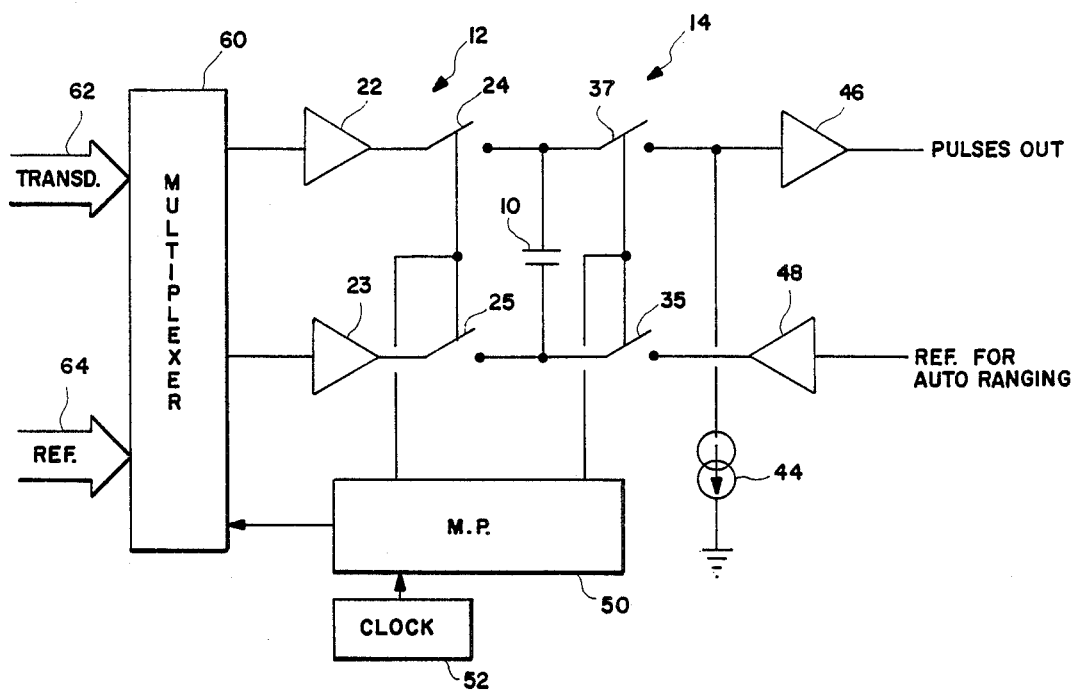
FIG. 4 is a schematic block diagram showing another embodiment of the invention.

The invention can be utilized with a 4-20 ma current loop where maximum power dissipation is limited to 48 mW. As shown in FIG. 4, which illustrates another embodiment of the invention, a differential input multiplexer 60 is used with a plurality of inputs 62 from a plurality of transducers, and a plurality of inputs 62 which can be used for auto-ranging. Four inputs of multiplexer 60 can be dedicated for inputs 62 and four other inputs for inputs 64. Multiplexer 60 sequentially selects one of the eight available inputs at a time for amplifiers 22 and 23 of the input circuit 12. In FIG. 4, the same reference numerals are utilized to designate the same or similar parts.

Multiplexer 60 is controlled by microprocessor 50. Switches 24,25 and 34,35 are also controlled by microprocessor 50, with priming established by clock 52, to charge and discharge capacitor 10. Comparator 46 generates output pulses while amplifier 48 processes the reference signal for autoranging.

As with the embodiment of FIG. 1, a constant current supply 44 is utilized for discharging capacitor 10 at constant rate to establish the duty cycle for the output pulses.

While specific embodiments of the invention have been shown and described in detail to illustrate the application of the principles of the invention, it will be understood that the invention may be embodied otherwise without departing from such principles.

What is claimed is:

1. A converter for converting the differential of a pair of analog signals to a digital pulse, comprising:
    a switching capacitor;
    an input circuit comprising a differential amplifier for receiving said pair of analog signals and applying said differential signal to said switching capacitor to charge said switching capacitor to a charge level which is proportional to said differential signal;
    an output circuit connectable to said switching capacitor and including a constant current source for discharging said switching capacitor from its charge level to a selected low level during a discharging period;
    switching logic means connected to said input and output circuits for connecting said input and output circuits one at a time to said switching capacitor for charging said switching capacitor to its charge level and for discharging said switching capacitor to the selected low level, said switching logic means connecting said switching capacitor to said input circuit for sufficient time to reach said charge level and connecting said switching capacitor to said output circuit for a time longer than said discharging period, said switching logic means comprising a microprocessor, said input circuit including a first pair of switches controllable by said microprocessor for connection of said differential amplifier to said switching capacitor, said output circuit including a second pair of switches controllable by said microprocessor for discharging said switching capacitor, operation of each pair of said first and second pair of switches occurring substantially simultaneously; and
    pulse generating means connected to said output circuit for generating a digital pulse having a duration equaling said discharging period.

2. A converter according to claim 1, wherein said pulse generating means comprises a comparator having one input connected to one side of said switching capacitor over said output circuit and another input connected to a reference voltage for establishing said selected low level of charge for said switching capacitor.

* * * * *